United States Patent
Kobayashi et al.

(10) Patent No.: US 7,059,709 B2
(45) Date of Patent: Jun. 13, 2006

(54) COMPOSITION FOR FORMING PIEZOELECTRIC, METHOD FOR PRODUCING PIEZOELECTRIC FILM, PIEZOELECTRIC ELEMENT AND INK JET RECORDING HEAD

(75) Inventors: Motokazu Kobayashi, Kanagawa (JP); Makoto Kubota, Kanagawa (JP); Shinji Eritate, Kanagawa (JP); Fumio Uchida, Osaka (JP); Chiemi Shimizu, Osaka (JP); Kenji Maeda, Gifu (JP)

(73) Assignees: Canon Kabushika Kaisha, Tokyo (JP); Fuji Chemical Co., Ltd., Osaka (JP)

( * ) Notice: Subject to any disclaimer, the term of this patent is extended or adjusted under 35 U.S.C. 154(b) by 99 days.

(21) Appl. No.: 10/665,572

(22) Filed: Sep. 22, 2003

(65) Prior Publication Data

US 2004/0125176 A1 Jul. 1, 2004

(30) Foreign Application Priority Data

Sep. 20, 2002 (JP) .............................. 2002-275602

(51) Int. Cl.
*B41J 2/045* (2006.01)
*H01L 41/04* (2006.01)
(52) U.S. Cl. ...................... 347/68; 347/70; 310/358
(58) Field of Classification Search ............ 347/68–72; 310/358; 29/25.35
See application file for complete search history.

(56) References Cited

U.S. PATENT DOCUMENTS

| | | | |
|---|---|---|---|
| 3,472,776 A | * 10/1969 | Derbyshire | 252/62.9 R |
| 5,751,313 A | * 5/1998 | Miyashita et al. | 347/45 |
| 6,109,738 A | * 8/2000 | Miyata et al. | 347/71 |
| 6,277,294 B1 | 8/2001 | Ozaki et al. | 216/27 |
| 6,331,259 B1 | 12/2001 | Ozaki et al. | 216/27 |
| 6,382,775 B1 | 5/2002 | Kubota et al. | 347/62 |
| 6,391,527 B1 | 5/2002 | Yagi et al. | 430/313 |
| 6,436,301 B1 | 8/2002 | Hiroki et al. | 216/27 |
| 6,474,780 B1 | 11/2002 | Kubota et al. | 347/45 |

FOREIGN PATENT DOCUMENTS

| | | |
|---|---|---|
| JP | 60-236404 | 11/1985 |
| JP | 9-92897 | 4/1997 |
| JP | 10-139594 | 5/1998 |
| JP | 10-290035 | 10/1998 |
| JP | 2002-166544 | * 6/2002 |

* cited by examiner

*Primary Examiner*—Manish Shah
*Assistant Examiner*—Geoffrey S. Mruk
(74) *Attorney, Agent, or Firm*—Fitzpatrick, Cella, Harper & Scinto

(57) ABSTRACT

A composition for forming a piezoelectric containing a dispersoid obtained from metallic compound, wherein the content of hafnium in the composition is 3,000 ppm or less.

4 Claims, 2 Drawing Sheets

COMPOSITION FOR FORMING PIEZOELECTRIC, METHOD FOR PRODUCING PIEZOELECTRIC FILM, PIEZOELECTRIC ELEMENT AND INK JET RECORDING HEAD

BACKGROUND OF THE INVENTION

1. Field of the Invention

The present invention relates to a composition for forming a piezoelectric, a method for producing a piezoelectric film by use of the composition, a piezoelectric element having the piezoelectric film, and an ink jet recording head.

2. Related Background Art

A piezoelectric film represented by lead zirconate titanate (PZT) is utilized as a piezoelectric element of an ink jet recording head. For forming a ferroelectric thin film for use in this application to express a sufficient electromechanical conversion capability (pressure for promoting displacement), it is necessary to promote crystallization of the film by a final heat treatment in any film formation process. Furthermore, in order to obtain a sufficient displacement which the element should possess, a thickness of about 1 µm to 25 µm is necessary.

The PZT film can usually be formed by a screen printing method, a sputtering method, a sol-gel method, a CVD method, a hydrothermal method or the like, and is usually annealed at a temperature of 700° C. or higher for obtaining crystals of a perovskite structure having piezoelectric properties. For increasing the thickness of the film, a deposition time for film formation is prolonged, or the film formation step is repeated two or more times. Among the film formation processes described above, the sol-gel method is excellent in composition controllability, and enables a thin film to be obtained easily by repeating coating and calcination. Furthermore, the film obtained by the sol-gel method is so dense that it is expected to have good piezoelectric characteristics without causing dispersion of a pressure promoting the displacement.

The sol-gel method is such that a substrate is coated with a sol containing hydrolysable compounds of constituent metals, partial hydrolysates thereof or partial polycondensates thereof as a raw material, the resultant coating film is dried and then heated in the air to form a metal oxide film, and the film is baked at a crystallization temperature of the metal oxide or higher temperature to crystallize the film to form a ferroelectric thin film. As the hydrolysable compound as a raw material, an organic compound such as a metal alkoxide, a partial hydrolysate thereof or partial polycondensate thereof is generally used. The sol-gel method enables a ferroelectric thin film to be formed most inexpensively and conveniently.

There is an organometallic decomposition process (MOD) as a process similar to the sol-gel method. The MOD process is such that a substrate is coated with a sol containing a heat decomposable organometallic compound, for example a β-diketone complex or carboxylate of a metal, the resultant coating film is heated in, for example, the air or oxygen, causing a solvent in the coating film to be evaporated and the metallic compound to be heat-decomposed to form a metal oxide film, and the film is baked at a crystallization temperature or higher temperature to crystallize the film. In this patent application, the sol-gel method, the MOD process and combinations thereof are called "sol-gel method" correctively.

Furthermore, ink jet printer heads using piezoelectric elements formed by the sol-gel method have been disclosed. For example, a methods has been disclosed in which using the sol-gel method, a sol containing a piezoelectric material is coated on a lower electrode two or more times, and the coating film is repeatedly heated to form a piezoelectric thin film of a piezoelectric element for use in the ink jet printer head (e.g., Japanese Patent Application Laid-Open No. H09-92897, Japanese Patent Application Laid-Open No. H10-139594 and Japanese Patent Application Laid-Open No. H10-290035).

Furthermore, a method of forming a piezoelectric thin film by the sol-gel method typically using a raw material (hereinafter referred to as sol) containing hydrolysable or heat decomposable organometallic compound such as alkoxides of constituent metals or hydroxides of constituent metals is well known to those skilled in the art (see Japanese Patent Application Laid-Open No. S60-236404, for example).

SUMMARY OF THE INVENTION

If a piezoelectric thin film is formed by a sol-gel method, there arises a problem such that electrical characteristics and piezoelectric characteristics may vary depending on the location, resulting in troubles occurring when such a piezoelectric thin film is applied to an ink jet printer head or the like. It can be considered that this problem will be solved by purifying raw materials of a sol to improve the purity thereof, but how much of which kinds of impurity components should be reduced to solve the problem is unknown.

The inventors repeatedly conducted various analyses and experiments on piezoelectric precursor sols as compositions for forming piezoelectric bodies, and found that hafnium contained in the sol is a main source of the problem, leading to the completion of the present invention. A principal object of the present invention is to provide a method for producing a piezoelectric film having location-dependent variations significantly reduced, and a piezoelectric precursor sol as a raw material sol in the piezoelectric by the sol-gel method. Furthermore, the present invention has as one of its objects the provision of a piezoelectric element and an ink jet recording head characterized by comprising the piezoelectric film described above.

For solving the problem described above, the inventors conducted studies on the relation between the content of hafnium in a prepared sol solution and location-dependent variations, specifically the relation between the content of hafnium and electric characteristics and piezoelectric characteristics in trying to improve the purity of raw materials required for preparation of the sol solution, and consequently found that location-dependent variations in electric characteristics and piezoelectric characteristics are considerably alleviated when the content of hafnium is 3,000 ppm or less, preferably 2,000 ppm or less, thus achieving the present invention.

Another object of the present invention is to provide a composition for forming a piezoelectric containing a dispersoid obtained from metallic compound, wherein the content of hafnium in the composition is 3,000 ppm or less.

Still another object of the present invention is to provide a method for producing a piezoelectric film, comprising the steps of coating a substrate with a composition for forming a piezoelectric containing a dispersoid obtained from metallic compound, of which the content of hafnium is 3,000 ppm or less, to form a coating film, drying the coating film, and sintering the dried coating film to obtain a piezoelectric film.

According to the present invention, a composition for forming a piezoelectric, of which the content of hafnium is 3,000 ppm or less, preferably 2,000 ppm or less, is provided. According to the present invention, a piezoelectric film having reduced location-dependent variations in electric characteristics and piezoelectric characteristics can be conveniently obtained using the composition for forming a piezoelectric. It is also possible to fabricate a PZT piezoelectric element excellent in piezoelectric characteristics from this piezoelectric film, and this element can be used for a variety of applications such as a piezohead of ink jet recording apparatus, for example.

DESCRIPTION OF THE PREFERRED EMBODIMENT

Figure 1:
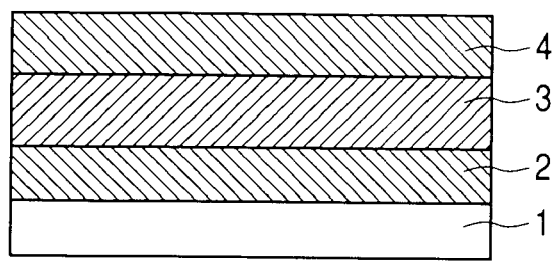
FIG. 1 is a longitudinal sectional view showing one example of the embodiment of a piezoelectric element of this invention, in which the piezoelectric element held between a lower electrode and an upper electrode on a substrate is partly enlarged for schematic illustration.

In a piezoelectric precursor sol containing a dispersoid obtained from metallic compound, containing at least titanium, zirconium and lead, the content of hafnium in the sol should be 3,000 ppm or less.

The content of hafnium in the piezoelectric precursor sol can be measured by, for example, ICP emission spectroscopy, atomic absorption, ion chromatography or the like. In the present invention, the ratio of the mass of hafnium contained in the piezoelectric precursor sol to the mass of all metal elements contained in the piezoelectric precursor sol was determined as the content of hafnium.

If a piezoelectric film is formed using a sol of which the content of hafnium is greater than 3,000 ppm due to inadequate purification of raw materials before and during preparation of the sol, hafnium is significantly precipitated in grain boundaries, resulting in location-dependent degradation in electric characteristics and piezoelectric characteristics. The content of hafnium is preferably 2,000 ppm or less, more preferably 1,500 ppm or less.

Metal oxides having a piezoelectric nature include barium titanate (BTO), lead titanate (PT), lead zirconate titanate (PZT), lanthanum dope lead zirconate titanate (PLZT), and a solid solution with magnesium lead niobate (PMN) added to PZT as a third component. Furthermore, these precursor sols may contain a very small amount of dope element. Examples of dope elements include Ca, Sr, Ba, Sn, Th, Y, Sm, Dy, Ce, Bi, Sb, Nb, Ta, W, Mo, Cr, Co, Ni, Fe, Cu, Si, Ge, U and Sc. The content thereof is 0.05 or less as an atom fraction of a metal atom in the general formula described below.

For the doping of these elements, a compound containing an element to be doped may be dissolved in a solvent and this solution may be added to the precursor sol, or the compound may be added directly to the precursor sol.

Among piezoelectrics capable of being fabricated according to the present invention, metal oxides having compositions expressed by general formula:
$Pb_{1-x}La_x(Zr_yTi_{1-y})O_3 (0 \leq x<1, 0 \leq y \leq 1)$, for example, lead zirconate titanate (PZT) and lanthanum dope lead zirconate titanate (PLZT) are piezoelectrics of perovskite structure, and owing to their high dielectric constants and excellent ferroelectric characteristics and optical characteristics, thin films of these compounds are already used in capacitor films, optical sensors and optical circuit elements and the like, and are expected to be used for new applications such as nonvolatile memories.

A method of forming a piezoelectric thin film by the sol-gel method typically using a raw material containing a hydrolysable or heat decomposable organometallic compound such as alkoxide of constituent metals or a hydroxide of constituent metals (hereinafter referred to as sol) is well known to those skilled in the art. The present invention is characterized in that the content hafnium in the sol is 3,000 ppm or less, preferably 2,000 ppm or less, and except for aspects concerning this characteristic, sol compositions and film formation processes may be generally same as those of conventional sol-gel methods and the like.

For the raw material of the sol of the present invention, a raw material from which hafnium has been removed by purification is used, and any raw material containing hafnium as a constituent element is not used.

Metallic compounds preferable as a raw material are hydrolysable or heat decomposable organic metallic compounds. Typical examples include, for example, metal hydroxides, organometallic alkoxides, metal organic esters, and metal complexes such as β-diketone complexes, but for metal complexes, various kinds of other complexes including amine complexes may be used. β-diketones include acetyl acetone (=2,4-pentanedione), heptafluorobutanoyl pivaloylmethane, dipivaloylmethane, trifluoroacetylacetone and benzoylacetone.

Specific examples of organometallic compounds suitable as a raw material include organic esters such as acetates (lead acetate and lanthanum acetate) and alkoxides such as diisopropoxy lead as lead compounds and lanthanum compounds. As titanium compounds, organometallic alkoxides such as tetraethoxy titanium, tetraisopropoxy titanium, tetra n-butoxy titanium, tetra i-butoxy titanium, tetra t-butoxy titanium and dimethoxy diisopropoxy titanium are preferable, but organic esters or organometallic complexes may be used. Zirconium compounds are considered in the same manner as the above titanium compounds. Other metallic compounds are also considered in the same manner as described above, but are not limited thereto. Furthermore, the above metallic compounds may be used in combination.

Furthermore, the organometallic compound as a raw material may be a combined organometallic compound containing two or more types of constituent metals, besides a compound containing one type of metal as described above. Examples of such combined organometallic compounds include $PbO_2[Ti(OC_3H_7)_3]_2$ and $PbO_2[Zr(OC_4H_9)_3]_2$.

Organometallic compounds of constituent metals for use as a raw material are subjected to distillation and recrystallization operations to remove hafnium, and then dispersed together in an appropriate organic solvent to prepare a sol, as a piezoelectric material, containing a precursor (may be represented by dispersoid) of a combined metal oxide (oxide containing two or more metals).

Hafnium is contained mainly as an impurity of zirconia of a metal raw material.

In the present invention, particularly, a compound such as zirconium alkoxide such as tetraethoxy zirconia, tetraisopropxy zirconia, tetra n-butoxy zirconia, tetra i-butoxy zirconia, tetra t-butoxy zirconia or dimethoxy diisopropoxy zirconia is used as a raw material of zirconia.

Methods for removing hafnium from these compounds may include distillation, recrystallization, sublimation and solvent extraction. Furthermore, it is also effective to remove hafnium in advance from raw materials for use in synthesis of these alkoxide compounds by the above method.

Furthermore, a solvent is selected as appropriate from well known various kinds of solvents in consideration of dispersibility and coating performance.

Solvents include alcohol based solvents such as methanol, ethanol, n-butanol, n-propanol and isopropanol, ether based solvents such as tetrahydrofuran and 1-4-dioxane, cellosolve based solvents such as methyl cellosolve and ethyl cellosolve, amide based solvents such as N,N-dimethyl formamide, N,N-dimethyl acetamide and N-methyl pyrolidone based solvents, and nitrile based solvents such as acetonitrile. Among them, alcohol based solvents are preferable. The amount of solvent for use in the sol-gel method in the present invention is such that the molar ratio of the solvent to the metallic compound is usually 10:1 to 200:1, preferably 20:1 to 100:1. By setting this molar ratio to 10:1 to 200:1, gelation easily occurs, and an appropriate amount of heat is generated during hydrolysis.

The ratio of each organometallic compound to be incorporated in the sol may be almost identical to the ratio in the piezoelectric film to be formed. However, the lead compound is generally so volatile that a loss of lead may be caused due to vaporization during heating for making the composition to a metal oxide or during calcination for crystallization. Therefore, lead may be made to exist in a slightly excessive amount (e.g., amount 2 to 20 wt % larger than the normal amount) making allowance for the loss of lead. The level of loss of lead varies depending on the type of lead compound and film formation conditions, and can be determined from experiments.

The sol with metallic compounds dispersed in an organic solvent may be used directly in film formation by the sol-gel method as a piezoelectric precursor sol of the present invention if the content of hafnium is 3,000 ppm, preferably 2,000 ppm. Alternatively, for promoting film formation, a hydrolysable organometallic compound (e.g., organometallic alkoxide) may be subjected to partial hydrolysis or polycondensation by addition of water and/or application of heat to the sol, and then used in film formation as a piezoelectric precursor sol of the present invention. That is, in this case, the raw material sol contains partial hydrolysates and/or partial polycondensates for at least some organometallic compounds.

For heating for partial hydrolysis, temperature and time are controlled so that complete hydrolysis cannot take place. If the organometallic compound is partially hydrolyzed, stability is imparted to the raw material sol, and thus is hard to be gelated, and a film can be formed uniformly. For heating conditions, it is appropriate that heating temperature is about 80 to 200° C., and heating time is 0.5 to 50 hours. During hydrolysis, the hydrolysate may be partially subjected to polycondensation due to the —M—O— bond (M=metal). This polycondensation is acceptable if it takes place partially.

The sol may contain a small amount of stabilizer. Addition of the stabilizer controls the hydrolysis velocity, the polycondensation velocity and the like of the raw material sol to improve the storage stability of the sol.

Compounds useful as the stabilizer include, for example, β-diketones (e.g., acetylacetone, dipivaloylmethane, benzoylacetone, etc.), ketonic acids (e.g., aceto acetate, propionyl acetate, benzoyl acetate, etc.), lower alkyl esters of methyl, propyl, butyl and the like of these ketonic acids, oxy-acids (lactic acids, glycolic acids, α-oxy-butyric acid, salicylic acid, etc.), lower alkyl esters of these oxy-acids, oxy-ketones (e.g., diacetone alcohol, acetoin, etc.), α-amino acids (e.g., glycine, alanine, etc.) and alkanolamines (e.g., dietahnolamine, triethanolamine, monoethanolamine, etc.).

The concentration of the sol solution is not specifically limited, and varies depending on the coating process used and existence/nonexistence of partial hydrolysis, but is generally preferably in the range of 0.1 to 20 wt % on a metal oxide basis.

In addition, various kinds of well known additives such as a polymerization promoter, a dispersion promoter, an antioxidant, a UV absorber, a dye and a pigment may be blended as necessary in the piezoelectric precursor sol of the present invention as appropriate after it is purified.

Furthermore, a compound having a binder effect may be blended in the piezoelectric precursor sol of the present invention for the purpose of increasing the thickness during coating. A compound including no hafnium in its composition is selected as a binder compound. Binder compounds include, for example, polyvinyl pyrolidone, polyvinyl butyral, polystyrene and polyvinyl alcohol.

By using the piezoelectric precursor sol of the present invention, piezoelectric films having improved location-dependent electric characteristics and piezoelectric characteristics, for example, barium titanate (BTO), a film of lead titanate (PT), a film of lead zirconate titanate (PZT) and the like can be formed, compared to a usual sol-gel method. These films are expected to have excellent ferroelectric characteristics and excellent electromechanical conversion capabilities.

The process for forming a piezoelectric film using the sol of the present invention will be described in detail below.

A substrate of a piezoelectric film to be formed can be selected as appropriate from metals, glass, ceramics and the like depending on a desired application, and it may be a substrate of silicon wafer or the like. The substrate may be subjected to an appropriate surface treatment in advance. For example, the substrate may be surface-treated with a silane coupling agent and an appropriate primer. Furthermore, a metal layer made of titanium, platinum, palladium, iridium or the like or an alloy thereof may be provided as an electrode on the surface of the substrate.

The coating process is not specifically limited, but coating is carried out by a conventional coating process, for example, a spin coating process, cast process, spray coating process, doctor blade process, die coating process, dipping process, printing process or the like. Among these processes, the spin coating process, the cast process, the spray coating process, the doctor blade process and the die coating process are preferable.

After coating, the coating film is dried to remove a solvent, whereby a piezoelectric precursor film can be formed. The temperature at this time is preferably about 100° C. to 300° C. depending on the solvent to be used.

When a thick film is required, coating and drying are repeatedly carried out.

The precursor film obtained by repeatedly carrying out coating and drying as required is heated to carry out a calcination step.

The conditions for the calcination vary depending on the type of metal oxide precursor sol and the application of the film. In the case of ferroelectric films such as lead zirconate titanium (PZT) and lanthanum dope lead zirconate titanate (PLZT), the calcination may be carried out at 400 to 1,400° C., preferably at 550 to 800° C. Furthermore, the calcination may carry out under any atmosphere such as inert gas atmosphere, oxygen containing atmosphere (air, etc.) or water vapor atmosphere, and may be carried out under a normal pressure, increased pressure or reduced pressure.

Applications of the perovskite-type piezoelectric film of the present invention include a piezoelectric element with the piezoelectric film held between electrodes. The piezoelectric film fabricated by the process for forming a sol and a film of the present invention has a reduced level of leak current, and is therefore deformed due to a piezoelectric effect if an appropriate voltage is applied thereto. Furthermore, by selecting the sol-gel method as a film formation process, the size and the shape of the piezoelectric element can be finely controlled easily. Thus, from the present invention, a piezoelectric element excellent in denseness and electric and piezoelectric characteristics, for example, a piezoelectric element having fine patterns, of which the resolution of 80 μm and the aspect ratio is greater than 3 can be formed by an easy process.

The preferred embodiment of this application will be described below with reference to FIG. 1.

FIG. 1 shows a configuration of one embodiment of a piezoelectric element in the present invention. In this figure, reference numeral 1 denotes a substrate. The substrate can be selected as appropriate from metals, glass, ceramics and the like depending on a desired application, and it may be a substrate of silicon wafer or the like. The substrate may be subjected to an appropriate surface treatment in advance. For example, the substrate may be surface-treated with a silane coupling agent and an appropriate primer. The piezoelectric element has a structure with a piezoelectric film 3 held between a lower electrode 2 and an upper electrode 4 in which the piezoelectric film 3 is formed on the surface of the lower electrode 2, and the upper electrode 4 is formed on the surface of the piezoelectric film 3.

Materials of the lower electrode 2 and the upper electrode 4 are not specifically limited, but any material that is usually used for the piezoelectric element is acceptable and for example, platinum, gold and the like are used. Same or different materials may be used for the lower electrode 2 and the upper electrode 4. The thickness of these electrodes is not specifically limited, but is preferably about 0.01 μm to 2 μm, more preferably 0.02 μm to 1 μm, for example.

Applications of the piezoelectric element described above include an ink jet recording head.

The preferred embodiment of this application will be described below with reference to FIG. 2.

Figure 2:
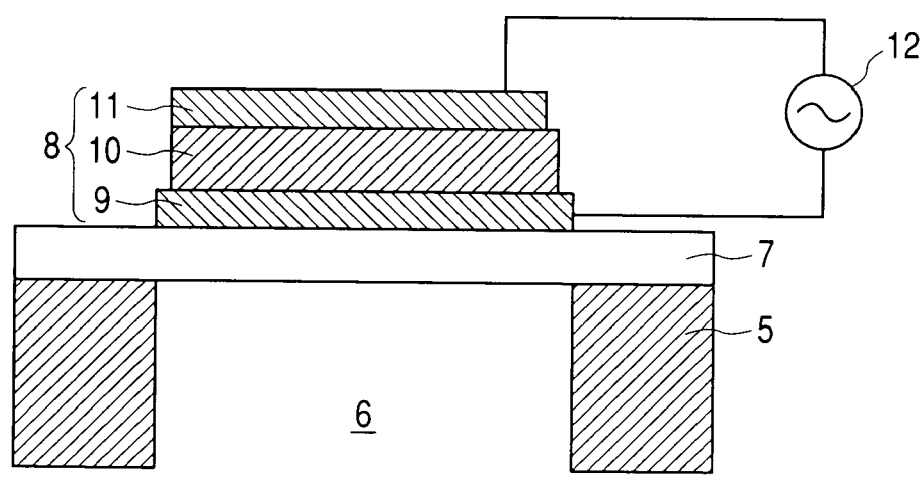
FIG. 2 is a longitudinal sectional view showing one example of the embodiment of this invention, in which an ink jet recording head with the piezoelectric element used for an actuator is partly enlarged for schematic illustration.

FIG. 2 a longitudinal sectional view in which the ink jet recording head using the piezoelectric element according to the present invention for an actuator is partly enlarged for schematic illustration. The recording head has a configuration same as that of the conventional recording head, and is constituted by head bases 5 and an actuator comprised of a diaphragm 7, a piezoelectric element 8 and a power source 12. The piezoelectric element 8 has a structure with a piezoelectric film 10 held between a lower electrode 9 and an upper electrode 11 in which the piezoelectric film 10 is formed on the surface of the lower electrode 9, and the upper electrode 11 is formed on the surface of the piezoelectric film 10.

The head base 5 is provided with a large number of ink nozzles (not shown) for discharging an ink, a large number of ink channels (not shown) each communicating with each of the ink nozzles, and a large number of ink chambers 6 as pressure chambers each communicating with each of the ink channels, and the diaphragm 7 is mounted in such a manner as to cover the entire upper surface of the head base 5, and the upper openings of all ink chambers 6 of the head base 5 are blocked by this diaphragm 7. The piezoelectric element 8 for giving a vibration driving force to the diaphragm 7 is formed in a position corresponding to each of the ink chambers 6. By applying a voltage to a selected desired piezoelectric element 8, the piezoelectric element 8 is deformed to vibrate the corresponding diaphragm 7. In this way, the volumes of ink chambers 6 in an area corresponding to the vibration of the diaphragm are changed so that an ink is squeezed out of ink nozzles through ink channels to perform printing.

The piezoelectric film 10 is made of PZT expressed by the chemical formula: $Pb(Zr_{1-x}Ti_x)O_3 (0.3 \leq x \leq 0.9$, preferably $0.4 \leq x \leq 0.9)$, or it is formed using PZT as a main component. The thickness of the piezoelectric film 10 is preferably 0.2 μm to 25 μm, more preferably 0.5 μm to 10 μm. By setting the thickness of the piezoelectric film 10 to 0.2 μm to 25 μm, a sufficient level of driving force can be obtained, and the piezoelectric element 8 can be adequately displaced with a moderate voltage.

Furthermore, the piezoelectric film 10 is formed by the ferroelectric film formation method of the present invention using the sol of the present invention.

The present invention will be described more specifically with Examples below, but the present invention is not limited the Examples.

EXAMPLES

Example 1

Zirconium normal propoxide (manufactured by KISHIDA CHEMICAL CO., LTD), a reagent described below, was used for preparation of a sol after sufficiently removing hafnium components therefrom by subjecting the reagent to distillation twice and then recrystallization once.

35.0 g of lead acetate trihydrate was dissolved in 2-methoxyethanol, water was removed from this solution by azeotropic distillation with a solvent, 12.6 g of tetraisopropoxy titanium and 15.7 g of zirconium normal propoxide were then added to the solution, the resultant mixture was circulated, 30.0 g of acetylacetone (stabilizer) was further added to the mixture, and the resultant mixture was sufficiently stirred. Thereafter, 6.0 g of water was added, and finally 2-methoxyethanol was added until the total amount reached 300 g to prepare a lead zirconate titanate (PZT) precursor sol having a concentration of 10 wt % on an oxide basis. This is A sol. The ratio of Ti to Zr (Ti/Zr) of this sol was 52/48.

The content of hafnium in the sol was 520 ppm as a value measured by ICP emission spectroscopy.

Example 2

Zirconium normal propoxide (manufactured by Wako Pure Chemical Industries, Ltd), a reagent described below, was used for preparation of a sol after sufficiently removing hafnium components therefrom by subjecting the reagent to distillation three times.

23.3 g of lead acetate trihydrate was dissolved in 150 g of propylene glycol monomethylether, water was removed from this solution by azeotropic distillation with a solvent, 10.4 g of zirconium normal propoxide and 8.4 g of tetraisopropoxy titanium were then added to the solution, the resultant mixture was circulated, 30.0 g of acetylacetone (stabilizer) was further added to the mixture, and the resultant mixture was sufficiently stirred. Thereafter, 6.0 g of water was added, and finally 2-methoxyethanol was added until the total amount reached 300 g.

The content of hafnium in the sol was 860 ppm as a value measured by ICP emission spectroscopy.

Example 3

Zirconium tetra-normal butoxide (manufactured by KISHIDA CHEMICAL CO., LTD), a reagent described below, was used for preparation of a sol after sufficiently removing hafnium components therefrom by subjecting the reagent to distillation once.

99.8 g of zirconia tetra-normal butoxide and 81.7 g of titanium n-butoxide were made to react with each other in 900 g of 1-methoxy-2-propanol, a material prepared by mixing 227.6 g of lead acetate trihydrate with 3.43 g of lanthanum acetate hydrate and removing water from the mixture was then added, and the resultant mixture was heated to combine together raw material metallic compounds. Then, 40 g of water, 80 g of acetic acid, 100 g of ethanol, 70 g of 2-ethylhexanoic acid and 10 g of polyvinyl pyrolidone K-30 (trade name; manufactured by Wako Pure Chemical Industries, Ltd) to carry out a hydrolysis reaction. Thereafter, solvents having boiling points of 100° C. or lower were completely removed by a rotary evaporator, and 1-methoxy-2-propanol was added to make an adjustment so that the concentration of metal oxide equivalent to that of the above composition formula reached 20 wt %. The content of hafnium in the sol was 2,650 ppm as a value measured by ICP emission spectroscopy.

Example 4

A sol was prepared in the same manner as in Example 3 except that zirconium tetra-normal butoxide (manufactured by Wako Pure Chemical Industries, Ltd) was used for preparation of the sol after removing hafnium components by subjecting the reagent to distillation once and then recrystallization once. The content of hafnium in the sol was 1,050 ppm.

Comparative Example 1

A sol was prepared in the same manner as in Example 1 except that zirconium normal propoxide (manufactured by KISHIDA CHEMICAL CO., LTD) was used directly.

The content of hafnium in the sol was 3,200 ppm as a value measured by ICP emission spectroscopy.

Comparative Example 2

A sol was prepared in the same manner as in Example 2 except that zirconium normal propoxide (manufactured by Wako Pure Chemical Industries, Ltd) was used directly.

The content of hafnium in the sol was 5,000 ppm as a value measured by ICP emission spectroscopy.

Comparative Example 3

A sol was prepared in the same manner as in Example 1 except that zirconium tetra-normal butoxide (manufactured by KISHIDA CHEMICAL CO., LTD) was used directly.

The content of hafnium in the sol was 8,300 ppm as a value measured by ICP emission spectroscopy.

The contents of hafnium in sols of Examples 1 to 4 and Comparative Examples 1 to 4 described above are shown collectively in Table 1.

TABLE 1

|  | Content of hafnium (ppm) |
| --- | --- |
| Example 1 | 520 |
| Example 2 | 860 |
| Example 3 | 2,650 |
| Example 4 | 1,050 |
| Comparative Example 1 | 3,200 |
| Comparative Example 2 | 5,000 |
| Comparative Example 3 | 8,300 |

Examples 5 to 8, Comparative Examples 4 to 6

Example of Fabrication of Piezoelectric Film

Film Formation Process

A silicon wafer of 2 cm per side was coated with titanium and platinum in the thickness of 0.2 μm by sputtering for use as a substrate. A film was formed on platinum of the substrate as described below using the sol prepared in Examples and Comparative Examples.

Specifically, any one of the sols described above was coated on the substrate at 3,000 rpm using a spin coater, and dried at 400° C. for 5 minutes to remove a solvent to form a precursor film. Tentative calcination was carried out at 650° C. for 15 minutes each time the coating and drying operation was repeated three times. After coating, drying and tentative calcination of 30 layers, the entire substrate was finally heat-treated at 700° C. for 1 hour to crystallize the film to obtain a 30-tier coating film of each kind of piezoelectric.

X-ray refraction measurements made on these piezoelectric films showed that every film was composed of a single phase of perovskite-type crystals being a ferroelectric phase. Furthermore, the obtained piezoelectric film was examined by ICP-MS to find that the content of hafnium in the film equaled to or less than the content of hafnium contained in the sol.

Method for Evaluating Piezoelectric Film 30 films of platinum each having a diameter of 500 μm were formed on the top of the piezoelectric film fabricated in this way by the spattering process. Using as electrodes these platinum films and platinum films below the piezoelectric film, residual polarization measurements were made. A hysteresis loop specific of ferroelectric materials such that spontaneous polarization is inverted by changing the scale of an external electric field from a positive to a negative or vice versa was observed. Measurements were made at all 30 points with a maximum applied voltage of 20 V, and the average and the standard deviation of resultant residual polarization values Pr were determined. The results are shown in Table 2.

From the results shown in Table 2, it can be understood that piezoelectric films of Examples tend to have greater residual polarization values Pr than those of piezoelectric films of Comparative Examples, while they have smaller standard deviations of residual polarization rates, and thus location-dependent variations of piezoelectric films of Examples are smaller than those of piezoelectric films of Comparative Examples.

Such hysteresis characteristics can be used for a memory unit, and a memory can be built if a plurality of piezoelectric elements as described above are placed and voltages can be applied individually to these piezoelectric elements.

TABLE 2

|  | Gel | Content of hafnium (ppm) | Average of Pr ($\mu C/cm^2$) | Standard deviation of Pr |
| --- | --- | --- | --- | --- |
| Example 5 | Example 1 | 520 | 24.0 | 0.53 |
| Example 6 | Example 2 | 860 | 26.2 | 0.67 |
| Example 7 | Example 3 | 2,650 | 22.3 | 0.99 |
| Example 8 | Example 4 | 1,050 | 24.8 | 0.82 |
| Comp. Ex. 4 | Comp. Ex. 1 | 3,200 | 22.0 | 1.34 |
| Comp. Ex. 5 | Comp. Ex. 2 | 5,000 | 21.5 | 1.82 |
| Comp. Ex. 6 | Comp. Ex. 3 | 8,300 | 22.6 | 2.31 |

Examples 9 to 12, Comparative Examples 7 to 9

Example of Fabrication of Piezoelectric Element

Figure 3:
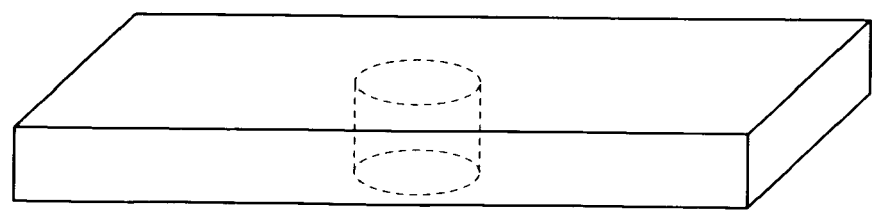
FIG. 3 is a perspective view showing one example of a form of a substrate used in Example 5 of this invention, in which a zirconia substrate designed to be partly hollowed out to reduce the thickness so that the vibration state of the piezoelectric film can be observed is enlarged for schematic illustration.
Figure 4:
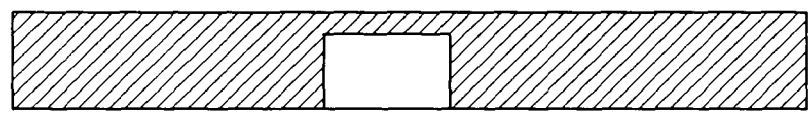
FIG. 4 is a longitudinal sectional view showing one example of a form of the substrate used in Example 5 of this invention, in which the zirconia substrate designed to be partly hollowed out to reduce the thickness so that the vibration state of the piezoelectric film can be observed is enlarged for schematic illustration.

For fabricating a piezoelectric element for an ink jet recording head having a configuration shown in FIGS. 3 and 4, a platinum electrode was deposited in the thickness of 0.5 μm as a lower electrode on the surface of a zirconia substrate partly hollowed out on the back side. The thickness of a vibration part is 10 μm. Any one of sols of Examples 1 to 4 and Comparative Examples 1 to 3 was coated on the top of the platinum electrode at 3,000 rpm, and the coating film was heated at 150° C. for 10 minutes to remove a solvent to form a precursor film. This coating and drying operation was repeated 36 times. Finally, the entire substrate was heat-treated at 700° C. for 1 hour to crystallize the film to obtain a 36-tier coating film of PZT. The thickness of this piezoelectric film was about 2 μm. Finally, platinum was deposited as an upper electrode on the piezoelectric film by spattering to fabricate a piezoelectric element of the present invention. In this way, 30 piezoelectric elements were fabricated with each of sols of Examples 1 to 4 and Comparative Examples 1 to 3.

For piezoelectric elements obtained using the sol of Example 1, the vibration width of the element during application of a voltage of 20 V was measured by a laser Doppler meter to recognize vibrations of several μm in a frequency range of 1 to 10 kHz. This displacement is sufficient for discharging an ink as an ink jet recording head. It was also found that the displacement decreases as the applied voltage is reduced, thus making it possible to control a discharge amount.

For piezoelectric elements fabricated with sol solutions of Examples 2 to 4 and Comparative Examples 1 to 3, a voltage of 10 V and 10 kHz was applied to between the upper electrode and the lower electrode to measure a displacement. The results of the average and the standard deviation of measured displacements are shown in Table 3.

From the results shown in Table 3, it can be understood that piezoelectric elements of Examples have smaller standard deviations of displacements than piezoelectric elements of Comparative Examples, and variations of piezoelectric elements of Examples are smaller than those of piezoelectric elements of Comparative Examples.

TABLE 3

|  | Gel | Content of hafnium (ppm) | Average of displacement (μm) | Standard deviation of displacement |
| --- | --- | --- | --- | --- |
| Example 9 | Example 1 | 520 | 1.2 | 0.57 |
| Example 10 | Example 2 | 860 | 1.4 | 0.78 |
| Example 11 | Example 3 | 2,650 | 1.1 | 0.95 |
| Example 12 | Example 4 | 1,050 | 1.5 | 0.86 |
| Comp. Ex. 7 | Comp. Ex. 1 | 3,200 | 1.4 | 1.46 |
| Comp. Ex. 8 | Comp. Ex. 2 | 5,000 | 1.1 | 1.92 |
| Comp. Ex. 9 | Comp. Ex. 3 | 8,300 | 0.9 | 2.42 |

Example 13

Example of Fabrication of Ink jet Recording Head

Figure 5:
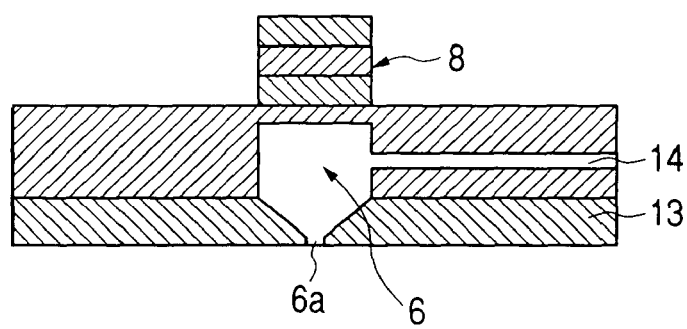
FIG. 5 is a longitudinal sectional view showing one example of a form of the ink jet recording head fabricated in Example 5 of this invention, in which the ink jet recording head having a nozzle provided in the lower part of the piezoelectric element obtained in Example 7 and comprising an inlet pipe so that discharge experiments can be conducted is partly enlarged for schematic illustration.
Figure 6:
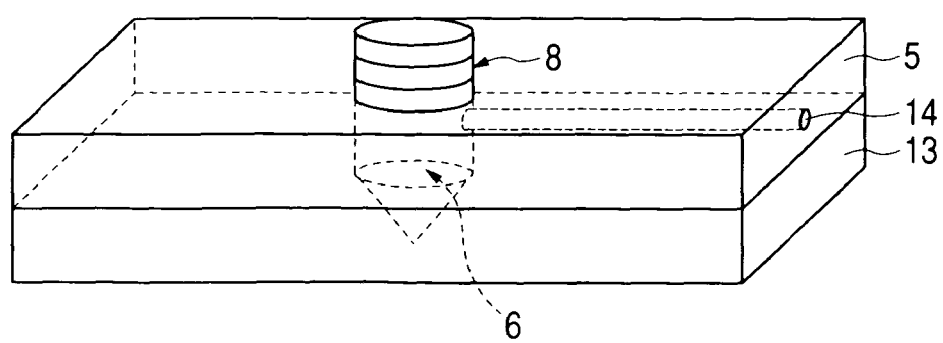
FIG. 6 is a perspective view showing one example of a form of the ink jet recording head fabricated in Example 5 of this invention, in which the ink jet recording head having a nozzle provided in the lower part of the piezoelectric element obtained in Example 5 and comprising an inlet pipe so that discharge experiments can be conducted is partly enlarged for schematic illustration.

A nozzle plate 13 provided with a nozzle 6a shown in FIGS. 5 and 6 was attached to the piezoelectric 10 element obtained in Example 9 described above, and an inlet channel 14 for introducing an ink was provided therein to fabricate an ink jet recording head. This ink jet recording head was used to conduct discharge experiments.

An ink for ink jet was introduced through an inlet pipe into the ink jet recording head fabricated as described above to fill the ink chamber with the ink. Then, an alternating voltage of 1 to 20 kHz and 10 V was applied to between the upper electrode and the lower electrode, and the state of discharge of the ink was observed by a microscope. As a result, the ink jet recording head could keep up with each frequency to discharge ink droplets. Furthermore, an ink jet recording head provided with a plurality of ink nozzles was fabricated to conduct experiments similarly, and it was recognized that the ink was discharged in the same manner as described above. In this way, it was shown that the piezoelectric element of the present invention is useful as an ink jet recording head.

The present invention has been described above showing Examples, but the present invention is not limited in the ratio of metal oxides constituting the piezoelectric film and the type of raw material. Various film formation processes other than the sol-gel method can be employed.

What is claimed is:

1. A method for producing a piezoelectric film for an ink jet recording head, said ink jet recording head comprising:
- a pressure chamber communicating with an ink discharge port;
- a diaphragm provided in correspondence with said pressure chamber; and
- a piezoelectric element provided in correspondence with the diaphragm,
- wherein an ink in said pressure chamber is discharged through said ink discharge port by a change of volume in said pressure chamber caused by the piezoelectric element,
- wherein the piezoelectric element comprises the piezoelectric film, and the piezoelectric film is held between a lower electrode and an upper electrode, and
- wherein said method comprises the steps of:
- coating a substrate with a composition for forming the piezoelectric film, to form a coating film, said composition containing a dispersoid obtained from a metallic compound, and the content of hafnium in said composition being 3,000 ppm or less;
- drying the coating film; and
- sintering the dried coating film to obtain the piezoelectric film.

2. The method according to claim 1, wherein said metallic compound is selected from the group consisting of organometallic alkoxides, organometallic complexes, metal organic salts, and metal hydroxides.

3. The method according to claim 1, wherein the content of hafnium contained in said composition is 2,000 ppm or less.

4. The method according to claim 1, wherein the content of hafnium contained in said piezoelectric film is 3,000 ppm or less.

* * * * *

UNITED STATES PATENT AND TRADEMARK OFFICE
CERTIFICATE OF CORRECTION

PATENT NO. : 7,059,709 B2
APPLICATION NO. : 10/665572
DATED : June 13, 2006
INVENTOR(S) : Kobayashi et al.

It is certified that error appears in the above-identified patent and that said Letters Patent is hereby corrected as shown below:

ON THE TITLE PAGE
Item (73) Assignees:, "Canon Kabushika Kaisha, Tokyo (JP);" should read --Canon Kabushiki Kaisha, Tokyo (JP);--.

COLUMN 2
Line 1, "methods" should read --method--.

COLUMN 5
Line 22, "propxy" should read --propoxy--.

COLUMN 6
Line 30, "dietahnolamine," should read --diethanolamine,--.

COLUMN 7
Line 26, "carry" should read --be carried--.

COLUMN 10
Line 66, "equaled" should read --was equal--.

COLUMN 12
Line 42, "piezoelectric 10" should read --piezoelectric--.

Signed and Sealed this

Seventh Day of August, 2007

JON W. DUDAS
*Director of the United States Patent and Trademark Office*